United States Patent
Li et al.

(10) Patent No.: US 10,519,539 B2
(45) Date of Patent: Dec. 31, 2019

(54) METHOD FOR HYDROGEN-FREE DIAMOND-LIKE COATINGS HAVING ISOLATED CARBON PARTICLE EMBEDDED WITHIN

(71) Applicant: City University of Hong Kong, Kowloon (HK)

(72) Inventors: Kwok Yan Li, Kowloon (HK); Abdul Wasy Zia, Kowloon (HK); Zhifeng Zhou, Kowloon (HK)

(73) Assignee: City University of Hong Kong, Kowloon (HK)

( * ) Notice: Subject to any disclaimer, the term of this patent is extended or adjusted under 35 U.S.C. 154(b) by 159 days.

(21) Appl. No.: 15/468,820

(22) Filed: Mar. 24, 2017

(65) Prior Publication Data

US 2018/0274080 A1 Sep. 27, 2018

(51) Int. Cl.
*C23C 16/26* (2006.01)
*C23C 14/35* (2006.01)
*C23C 16/27* (2006.01)

(52) U.S. Cl.
CPC .............. *C23C 14/35* (2013.01); *C23C 16/26* (2013.01); *C23C 16/27* (2013.01)

(58) Field of Classification Search
CPC .................................. C23C 16/26; C23C 16/27
See application file for complete search history.

(56) References Cited

U.S. PATENT DOCUMENTS 4,873,115 A * 10/1989 Matsumura ........... C23C 16/272 427/577
5,462,772 A * 10/1995 Lemelson .................. B01J 3/08 427/181

(Continued)

FOREIGN PATENT DOCUMENTS

| JP | 2011-99137 | * | 5/2011 |
| WO | WO 99/27157 | * | 6/1999 |
| WO | WO 2016/042945 | * | 5/2011 |

OTHER PUBLICATIONS

Bubenzer, A., et al., "Rf-Plasma deposited amorphous hydrogenated hard carbon thin films: Preparation, properties, and applications". Journal of Applies Physics 54, 4590 (1983), pp. 4590-4595.*

(Continued)

*Primary Examiner* — Bret P Chen
(74) *Attorney, Agent, or Firm* — Norton Rose Fulbright US LLP

(57) ABSTRACT

Systems and methods herein produce an isolated carbon particle embedded diamond-like carbon (DLC) coating having increased toughness, increased hardness, and enhanced wear resistance. In embodiments, a physical vapor deposition (PVD) chamber houses a pure graphite target at a distance from a substrate, and an in-situ synthesis of isolated carbon particles simultaneous with hydrogen-free DLC coating deposition is provided through unbalanced magnetron sputtering by localized injection of helium gas in a pulse mode with different durations. The resultant coating may include carbon while omitting other elements, and the carbon particles form covalent bonding with the host DLC matrix. Processes disclosed herein are easier to control and manipulate as compared to traditional metal doped DLC coatings.

16 Claims, 3 Drawing Sheets

(56) References Cited

U.S. PATENT DOCUMENTS

| | | | | |
|---|---|---|---|---|
| 2003/0177752 | A1* | 9/2003 | Nakagawa | B21L 9/065 59/5 |
| 2006/0183339 | A1* | 8/2006 | Ravi | H01L 21/76829 438/758 |
| 2009/0162677 | A1* | 6/2009 | Cooper | C23C 14/0605 428/457 |
| 2011/0170236 | A1* | 7/2011 | Young | H01G 9/016 361/502 |
| 2013/0146443 | A1* | 6/2013 | Papa | C23C 14/35 204/192.16 |
| 2015/0376532 | A1* | 12/2015 | Hovsepian | C23C 14/165 204/192.15 |
| 2017/0253825 | A1* | 9/2017 | Tsuji | C23C 14/06 |

OTHER PUBLICATIONS

Koga, Kazunori, et al., "Carbon Particle Formation Due to Interaction Between H2 Plasma and Carbon Fiber Composite Wall". IEEE Transactions on Plasma Science, vol. 32, No. 2, Apr. 2004, pp. 405-409.*

Liu, Yan, et al., "Evidence of graphitization of diamond-like carbon films during sliding wear". Journal of Materials Science 32 (1997) 3491-3495.*

Cui, J. et al., "Mechanical and Tribological Properties of Ti-DLC Films with Different Ti Content by Magnetron Sputtering Technique," Applied Surface Science 258 (2012) 5025-5030, 6 pages.

Zhang S. et al., "Magnetron-sputtered nc-TiC/a-C(Al) Tough Nanocomposite Coatings," Thin Solid Films 467 (2004) 261-266, 6 pages.

Guo, P. et al., Structural Properties and Surface Wettability of Cu-containing Diamond-like Carbon Films Prepared by a Hybrid Linear Ion Beam Deposition Technique, Thin Solid Films 584 (2015) 289-293, 5 pages.

Dai, W. et al., "Microstructure and Mechanical Property of Diamond-like Carbon Films with Ductile Copper Incorporation," Surface & Coatings Technology 272 (2015) 33-38, 6 pages.

Wu, Z. et al., "Microstructure and Surface Properties of Chromium-doped Diamond-Like Carbon Thin Films Fabricated by High Power Pulsed Magnetron Sputtering," Applied Surface Science 276 (2013) 31-36, 6 pages.

Manninen, N.K. et al., "Influence of Ag Content on Mechanical and Tribological Behavior of DLC Coatings," Surface & Coatings Technology 232 (2013) 440-446, 7 pages.

Ji, L. et al., "Microstructure and Mechanical Properties of Mo/DLC Nanocomposite Films," Diamond & Related Materials 17 (2008) 1949-1954, 6 pages.

Yu, X. et al., "Influence of Silver Incorporation on Toughness Improvement of Diamond-Like Carbon Film Prepared by Ion Beam Assisted Deposition," The Journal of Adhesion, 89:578-593, 2013, 16 pages.

Wang, Y. X. et al., "Toward Hard Yet Tough Ceramic Coatings," Surf. Coat. Technol. 258 (2014) 1-16, 16 pages.

Musil, J., "Hard Nanocomposite Coatings: Thermal Stability, Oxidation Resistance and Toughness," Surface & Coatings Technology 207 (2012) 50-65, 16 pages.

Amaratunga, G.A.J. et al., "Hard Elastic Carbon Thin Films From Linking of Carbon Nanoparticles," Nature 383 (1996) 321-323, 3 pages.

Chhowalla, M. et al., "Generation and Deposition of Fullerene- and Nanotube-rich Carbon Thin Films," Philosophical Magazine Letters 75 (1997) 329-335, 7 pages.

Chhowalla M. et al., "Thin Films of Fullerene-like $MoS_2$ Nanoparticles with Ultra-low Friction and Wear," Nature 407 (2000) 164-167, 4 pages.

* cited by examiner

METHOD FOR HYDROGEN-FREE DIAMOND-LIKE COATINGS HAVING ISOLATED CARBON PARTICLE EMBEDDED WITHIN

TECHNICAL FIELD

Aspects of the present disclosure relate generally to diamond-like carbon (DLC) coating, and more particularly, to systems and methods that produce an isolated carbon particle embedded DLC coating having simultaneous increased toughness, increased hardness, and enhanced wear resistance.

BACKGROUND OF THE INVENTION

Diamond-like carbon (DLC) is known in the art as being a class of amorphous carbon material that exhibits typical properties in between diamond and graphite. Industry desires DLC materials having properties closer to diamond, which has the highest hardness and high wear resistance. The quality of DLC mainly depends on the preparation method and experimental conditions. DLC usually practices in form of thin films/coatings deposited on various substrates. Normally DLC coatings have an amorphous or quasi-amorphous structure with carbon atoms bonded in mixed sp3- and sp2-hybridizations. Thus, their properties can range from semi-metallic and graphitic, to insulating and diamond-like depending on the $sp^3/sp^2$ ratio. Conventional diamond-like carbon (DLC) coatings coat a substrate material to improve the material's surface qualities, due to their extreme characteristics of high hardness and elastic modulus, high optical transparency, high electrical resistivity, high thermal conductivity, chemical inertness, excellent tribological performance and biocompatibility. For example, a material may be coated with a conventional DLC coating to reduce abrasive wear and friction thereby increasing the durability and service life of the coated material. Machinery and tools such as drill bits, screws, cutting devices (e.g., knives, shears, clippers, blades, razors, and the like) endmills, molds, dies, and components in assembly line manufacturing and packaging may be coated with a conventional DLC coating in an effort to extend the endurance of the machinery and tools. In other examples, vehicle engines and components thereof (e.g., pistons) may be coated with a conventional DLC coating to reduce abrasive wear and friction thereby increasing speed, durability, and longevity. A conventional DLC coating is also used in computer technology, for example, hard disk platters and hard disk reader heads, which may be coated with a thin DLC coating to prevent hardware crashes caused by friction and/or wear and tear.

In addition to reducing abrasive wear and friction, thereby increasing the durability and life of the coated material, a conventional DLC coating also has unique electrical properties and biocompatibility. A conventional DLC coating is used to coat the edges of shaving razors, which reduces friction against the skin thereby preventing razor burn. Further, conventional DLC coatings are useful in medical therapies such as brachytherapy and have improved artificial joints and/or bones (e.g., knees, hips, and the like) as well as heart valves/pumps.

While various industries find uses for DLC coatings, conventional DLC coatings are in need of improvement. Properties of interest in DLC coating include hardness (e.g., resistance to scratching), toughness (e.g., resistance to fractures, cracks, breaks, ruptures, and the like), wear (e.g., resistance to erosion), stiffness (e.g., resistance to deformation), strength (e.g., resistance of failure or plasticity deformation), ductility (e.g., susceptibility to deformity under tensile stress), brittleness (e.g., susceptibility to fracture prior to plasticity deformation), and the like. Conventional DLC coatings suffer a problematic paradox, wherein improving one or more property of a conventional DLC coating likely diminishes one or more other property of the conventional DLC coating.

For example, conventional DLC coatings were originally hard DLC coatings. Unfortunately, hard DLC coatings are brittle and experience reduced life due to cracking failures. This potential drawback of DLC coatings limits severely their industrial applications. The extraordinarily high residual stress in combination with the chemical inertness of DLC leads to the poor film-to-substrate adhesion strength, and may cause brittle fracture or delamination of the coatings from their substrates. This tendency usually becomes more evident when the film thickness is above 1 µm. Traditional strategies to overcome the cracking failures involved doping metal particles by co-sputtering metal with graphite and combining the doped metal particles with a DLC matrix, thereby making a metal doped DLC coating. The artificially induced toughening element (e.g., metal element) improves the toughness of DLC coatings but regrettably may undesirably effect the DLC coatings' hardness, strength, and the like. Toughness represents the ability of a material to absorb energy during deformation up to fracture. A material is generally considered to be tough if it can withstand high level of loading without brittle fracture. The toughness measurements for thin films/coatings can be performed by bending, buckling, indentation and scratch tests. Some toughening methodologies for hard nano-structural coatings have been proposed, such as ductile phase toughening, nano-grain boundary strengthening and sliding, composition and structure grading, multilayer architecture, phase transformation, and compressive stress toughening, etc. Hence, toughness is highly microstructure dependent. Some studies have been conducted on co-sputtering techniques using various metallic elements, such as, titanium (Ti), Al (aluminum), Cu (copper), Cr (chromium), Ag (silver), Ni (nickel), and Mo (molybdenum). For example, a study created a doped DLC coating using Cr. The Cr containing DLC coating demonstrated increased toughness from 0.85 $MPa \cdot m^{1/2}$ to ~1.0 $MPa \cdot m^{1/2}$ at the expense of hardness, which was reduced by 38%.

That being said, the preponderance of DLC studies focus on the DLC's microstructure, stress reduction, and tribology behaviors. There are few reports that address the effects of metal incorporation on the toughness of DLC coatings as well as the hardness of the DLC coatings. For example, in another study, DLC coating hardness was reduced by ~50% after doping with tungsten in order to improve the cracking resistance by 36%. That being said, the study did not address the effect tungsten had on the DLC coating's toughness. B. D. Beake, T. W. Liskiewicz, V. M. Vishnyakov, M. I. Davies. *Development of DLC coating architectures for demanding functional surface applications through nano- and micromechanical testing.* SURFACE & COATINGS TECHNOLOGY 284 2015 334-343. In contrast, another study reports an increase in toughness by doping 15% to 25% Ag fraction but does not report the metal doping's effect on the DLC's hardness. N. K. Manninen, F. Ribeiro, A. Escudeiro, T Polcar, S. Carvalho, A. Cavaleiro, *Influence of Ag content on mechanical and tribological behavior of DLC coatings,* SURFACE & COAT- INGS TECHNOLOGY 232 (2013) 440-446. Very few reports highlight the controversy between a DLC coating's hardness and toughness within the study.

BRIEF SUMMARY OF THE INVENTION

The studies described above differ from embodiments described herein both in the preparation process and resulting architecture. Previous methods involved high energy and high-pressure gradients, as a result, particles (a) may disintegrate once reaching the substrate surface due to high kinetic energy or (b) result in mixed entities like particles and nanotubes in addition to (c) a mixture of different forms of carbon (chemically mix composition/heterogeneous). However, the processes disclosed herein produce particles by a physical mechanism. Additionally, these particles may have the identical shape (e.g., spherical), and the particle size can be controlled by manipulating the growth conditions. Moreover, the characterization of DLC samples prepared with new methods herein present a simultaneous increase in hardness, fracture toughness, and wear performance, which is unique from the literature trend that compromises hardness reduction in order to achieve increased fracture toughness.

In embodiments, systems and methods synthesize carbon particle/DLC composite coatings by using a PVD technique (e.g., magnetron sputtering). These methods have been used to produce non-agglomerated metallic nanoparticles with narrow size distribution. Moreover, PVD techniques (e.g., magnetron sputtering) have the advantage of being able to produce atomic vapor from a variety of target materials. In embodiments, pulverization inert gas, (e.g., argon, helium, and the like) is injected into the chamber to maintain a high pressure near the sputtering target (e.g., cathode). The sputtered atoms near the cathode surface condense after multiple collisions with inert gas, and consequently small clusters grow by aggregation. In embodiments, the condensation of sputtered atoms forms small nuclei, and the coalescence of small nuclei leads to the formation of larger spherical particles. The kinetic energy of small clusters is reduced by collisions with the inert gas atoms, which ensures a soft landing of the clusters onto the desired substrates, and the structural and morphological properties of the particles can thus be retained. If desired, systems and methods herein can control the dispersion and size of the carbon particles in an amorphous DLC matrix.

As explained above, conventional diamond-like carbon (DLC) coatings suffer from a problematic paradox, wherein improving one or more property of a conventional DLC coating likely diminishes one or more other property of the conventional DLC coating. Example systems and methods herein overcome this paradox and produce isolated carbon particle embedded DLC coatings having a simultaneous increased toughness and increased hardness as compared to conventional DLC coatings. Further, example isolated carbon particle embedded DLC coatings demonstrate an increased wear resistance as compared to conventional DLC coatings.

Example methods provided herein create an isolated carbon particle embedded DLC coating by depositing a diamond-like carbon (DLC) coating on a substrate and simultaneously synthesizing isolated carbon particles via unbalanced magnetron sputtering. In embodiments, synthesizing isolated carbon particles comprises injecting a helium pulse. Further, embodiments herein allow for selectable control of the carbon particles. For instance, a user may selectably control carbon particle formation, carbon particle size, a carbon particle distribution, and/or the like, for example, by manipulating: a helium pulse position and/or orientation as compared to a plasma plume, helium pulse injection duration, helium flow rate, a distance between a target and the substrate, and/or the like.

Example devices include one or more substrate having an isolated carbon particle embedded DLC coating thereon comprising a diamond-like carbon (DLC) coating with isolated carbon particles embedded therein. Example isolated carbon particle embedded DLC coatings may include a plurality of layers wherein the isolated carbon particles are embedded within one, two or more of the plurality of layers. In embodiments, the amount of the isolated carbon particles embedded within the DLC coating is below a pre-selected threshold amount. Further, in embodiments, the amount of the isolated carbon particles embedded within the DLC coating is selected based on a characteristic of the device; for example, the characteristic of the device may be at least one of an engine component, a component of a medical device, a machinery component, a component of a microelectromechanical (MEMS) devices, and a component of a cutting device.

Further, in embodiments the size of the isolated carbon particles embedded within the DLC coating may be smaller than a pre-selected threshold size, and/or the size may be selected based on a characteristic of the device. In embodiments, the size is at least one of 110±20 nm, 250 nm-350 nm, 700 nm, and agglomeration of 2 μm composed of 100 nm particles. Further still, the isolation distance between the isolated carbon particles may be pre-selected; for example, the isolation distance may be less than 5 μm or between 5 μm and 10 μm. In embodiments, the isolation distance may be the distance between carbon particles embedded within a same layer and/or the distance between carbon particles embedded within different layers.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which.

DETAILED DESCRIPTION OF THE INVENTION

Figure 1:
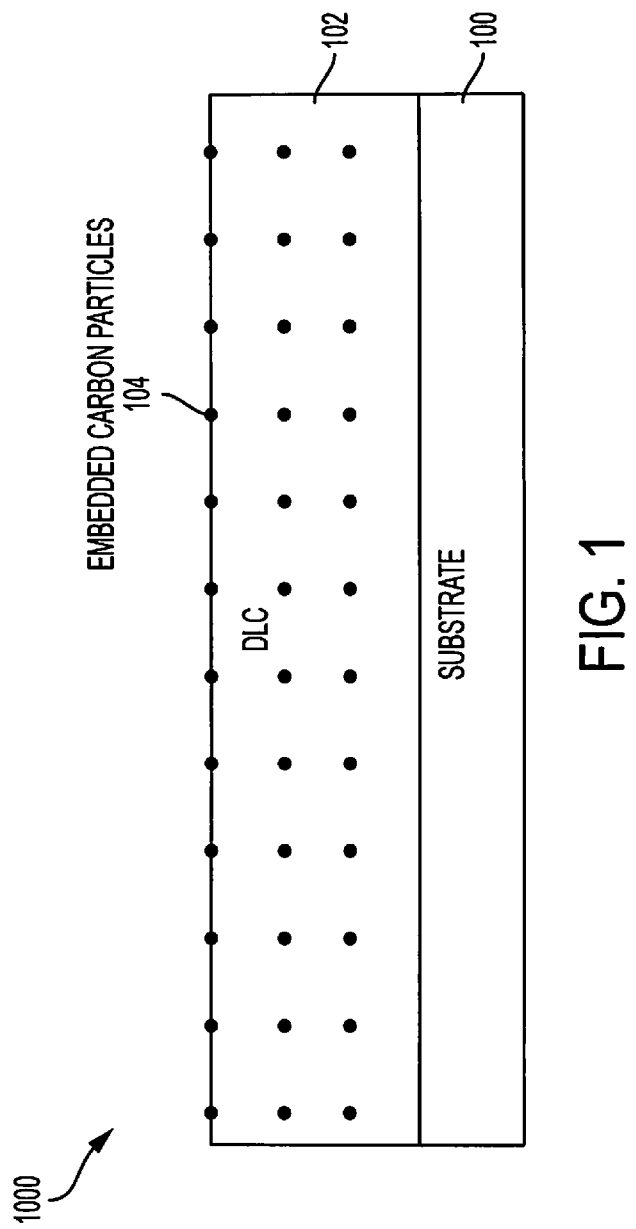
FIG. 1 shows an example isolated carbon particle embedded DLC coating.

Example systems and methods herein produce an isolated carbon particle embedded DLC coating having increased toughness, increased hardness, and enhanced wear resistance. In embodiments, a physical vapor deposition (PVD) chamber houses a target at a distance from a substrate, and an in-situ synthesis of isolated carbon particles simultaneous with DLC coating deposition is provided through unbalanced magnetron sputtering. FIG. 1 shows an example device 1000 having a substrate 100 upon which a DLC coating 102 is deposited. Embedded within DLC coating 102 are embedded carbon particles 104. The DLC coating 102 may be hydrogen-free.

The in-situ incorporation of hydrogen-free carbon particles into the DLC matrix may be performed by magnetron sputtering during DLC deposition. In embodiments, the carbon particles form covalent bonding with the host carbon matrix. The depositions may be carried out inside a high vacuum chamber (e.g., background gas pressure $<3\times^{-4}$ Pa). During magnetron sputtering, an Ar working gas pressure may be 0.13 Pa during the sputtering process, which is controlled by a mass flow controller at constant flow mode. Carbon atoms may be generated by sputtering a pure graphite target in a glow discharge of Ar.

In example embodiments, the mean free path for the deposited particles may be about 5 cm. The sputtered carbon atoms arrive at the substrate without experiencing many collisions, resulting in the formation of continuous coatings on the substrate. Plasma quenching may be realized by the injection of pure helium (He) gas in front of the graphite target (e.g., cathode) in a pulse mode, without interrupting the original sputtering process. The sharp pressure rise due to the helium injection (e.g., 100-1000 Pa) around the cathode causes multiple collisions between He atoms and the sputtered carbon atoms. The mean free path for the sputtered species may reduce to 5-50 μm. Then the sputtered atoms may rapidly condense and subsequently grow into clusters in the vapor before they reach the substrate. Parts of the small clusters self-assemble to form nano-particles, depending on the processing conditions. The injection time of helium gas may be made short (e.g., in a pulse mode). After that, the helium gas in the chamber may be evacuated quickly by the vacuum chamber's vacuum system, and the deposition of DLC may continue under normal conditions in an Ar atmosphere (e.g., pure Ar atmosphere). As a result, pure DLC coatings incorporated with embedded carbon particles may be synthesized on the substrates located at a distance from the cathode. Helium is a desirable candidate for quenching because of its small atomic mass and inert property. In addition, He has a very low sputtering yield for target materials, and the ionization is more difficult due to the higher ionization energy as compared to argon (Ar). Therefore, a short injection of helium gas into the coating chamber does not negatively affect the sputtering yield of graphite target.

In embodiments, pure Ar gas is used for continuous sputtering of a graphite target at lower pressure, while pure He gas is injected for short quenching of sputtered carbon atoms at higher pressure. The resultant carbon particle doped DLC coatings maintains a very high purity, because embodiments avoid the use of reactive gas such as nitrogen or oxygen. The size and distribution of the carbon particles may be controlled based on several factors, such as sputtering power, gas pressure, target-to-substrate distance, bias voltage, pulsed injection time, and number of injections, etc. In embodiments, it is possible to control the distribution of carbon particles along the film thickness direction.

Figure 2:
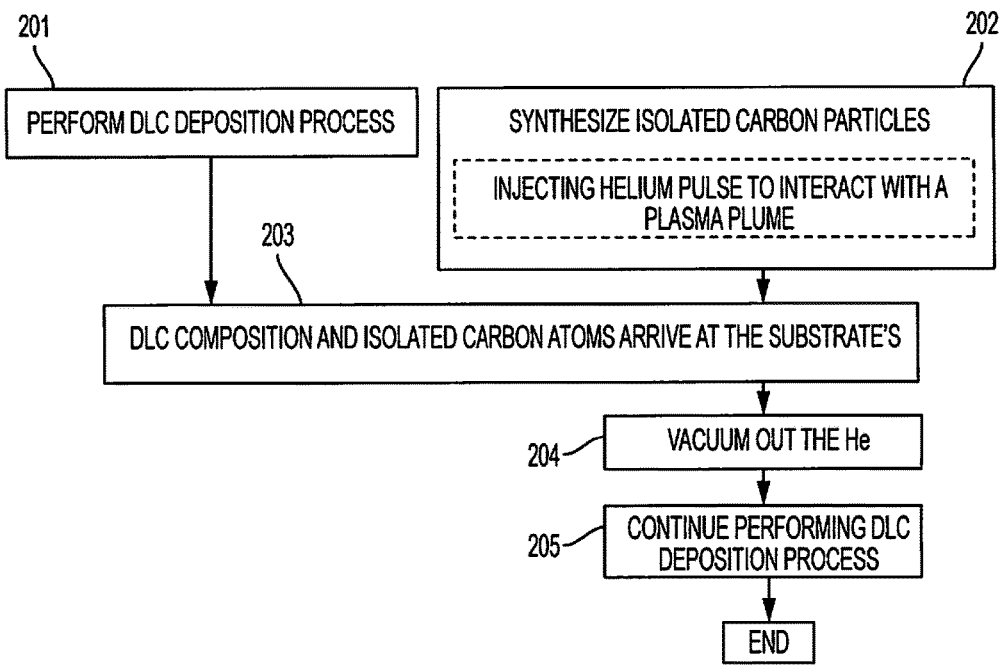
FIG. 2 shows an example method of producing an isolated carbon particle embedded DLC coating.

FIG. 2 shows an example method of producing an isolated carbon particle embedded DLC coating 2000. In an embodiment, during a DLC deposition process 201 using a flow of Ar, the method may simultaneously synthesize isolated carbon particles 202. Synthesizing isolated carbon particles may comprise injecting one or more helium (He) pulse (e.g., from a cathode side) to interact with a plasma plume. He has a higher ionization energy than argon (Ar), and He has the smallest molecular weight of the inert gasses. As a result, in comparison to higher molecular weight gasses, a small volume of He contains a larger number of He molecules that will reduce the mean free path. He molecules have high kinetic energy, and the He molecules collide with carbon atoms numerous times. In the plamsa plume, the He molecules' speed slows down due to their energy being extracted during the collisions. Meanwhile, due to a number of collisions, carbon atoms stick with each other physically; and due to electronegativity, a chemical bonding occurs in between carbon atoms. As a result, the DLC composition and isolated carbon particles arrive at the substrate's surface and deposit thereon 203. Upon formation of a desired carbon particle embedded layer, the chamber may vacuum out the He (step 204), and the DLC deposition process using Ar may continue (step 205) until the DLC coating is complete and the process ends. If multiple layers of carbon embedded DLC layers are desired, then steps 202 to 204 may be repeated as many times as desired until the deposition process is complete and the process ends. By time spacing the recidivism of steps 202 to 204, the user can control which layers of the DLC coating has embedded carbon therein and which layers lack embedded carbon particles.

In embodiments, a user may selectably control the composition of the isolated carbon particle embedded DLC coating. For example, a user may selectably control carbon particle formation, carbon particle size, and carbon particle distribution by manipulating aspects of the isolated carbon particle embedded DLC coating production process. For instance, a user may manipulate the He pulse position and orientation as compared to the plasma plume, the He injection duration, the He flow rate, the target to substrate distance, and/or the like. As a result of the various selections of the user, the resulting isolated carbon particle embedded DLC coating may have an hardness of a value selected by the user, toughness of a value selected by the user, and/or wear resistance of a value selected by the user. Further, if desired, some or all of the selected values may be increased simultaneously as compared to a conventional DLC coating.

Figure 3:
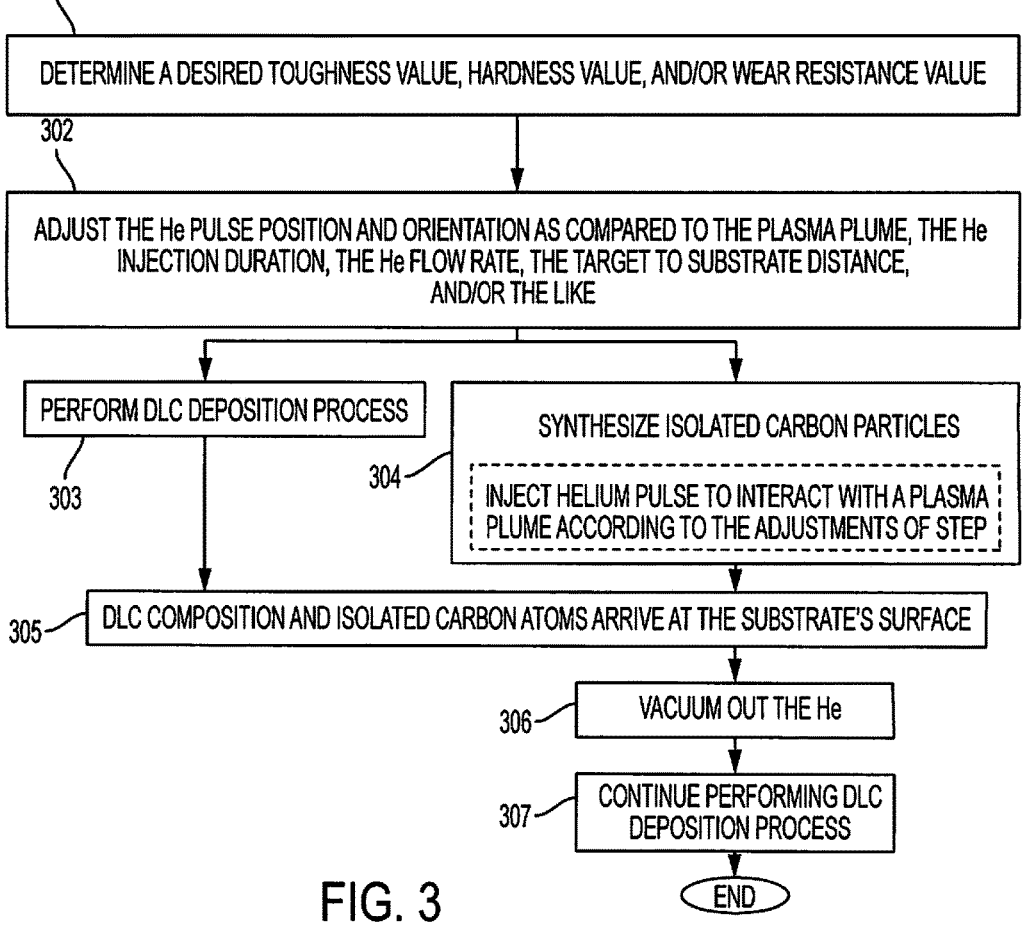
FIG. 3 shows an example method of producing an isolated carbon particle embedded DLC coating with user selectable parameters.

FIG. 3 shows an example method of producing an isolated carbon particle embedded DLC coating with user selectable parameters. In this example, at step 301, a user may determine a desired toughness value, hardness value, and/or wear resistance value. Based on this determination, at step 302, the user may adjust aspects of the production process, for example, the He pulse position and orientation as compared to the plasma plume, the He injection duration, the number of He injections and the amount of time between He injections, the He flow rate, the target to substrate distance, and/or the like. Further, a PVD chamber performing PVD may perform a DLC deposition process (step 303) and simultaneously synthesize isolated carbon particles (step 304). In this example, synthesizing isolated carbon particles is performed by injecting one or more helium (He) pulse to interact with a plasma plume according to the adjustments performed in step 302. At step 305, the DLC composition and isolated carbon particles arrive at the substrate's surface and deposit thereon. Upon finishing the DCL layer having carbon particles embedded therein, in step 306, the He is removed from the chamber (e.g., vacuumed out of the chamber), and if desired the DLC deposition process continues (step 307). If multiple DLC layers of embedded carbon particles are desired, steps 304 to 307 may be repeated as many times as is desired. Once all the DLC layers are complete, the process ends. By time spacing the recidivism of steps 304 to 306, the user can control which layers of the DLC coating has embedded carbon therein and which layers lack embedded carbon particles.

Hardness: In embodiments, the embedded carbon particles make a covalent bonding with a host carbon matrix, which increases the overall hardness of the isolated carbon particle embedded DLC coating. Further, in embodiments, the embedded carbon particles are a closely-packed structure, which increases the overall hardness of the isolated carbon particle embedded DLC coating. However, in example embodiments, the isolated carbon particle embedded DLC coating's hardness is related to the carbon particle size, and carbon is graphitic in nature. Thus, once a threshold size of carbon particles, a threshold quantity of carbon particles, and/or combination thereof is reached, the size and/or quantity of carbon particles may begin reducing the isolated carbon particle embedded DLC coating's hardness.

Figure 4:
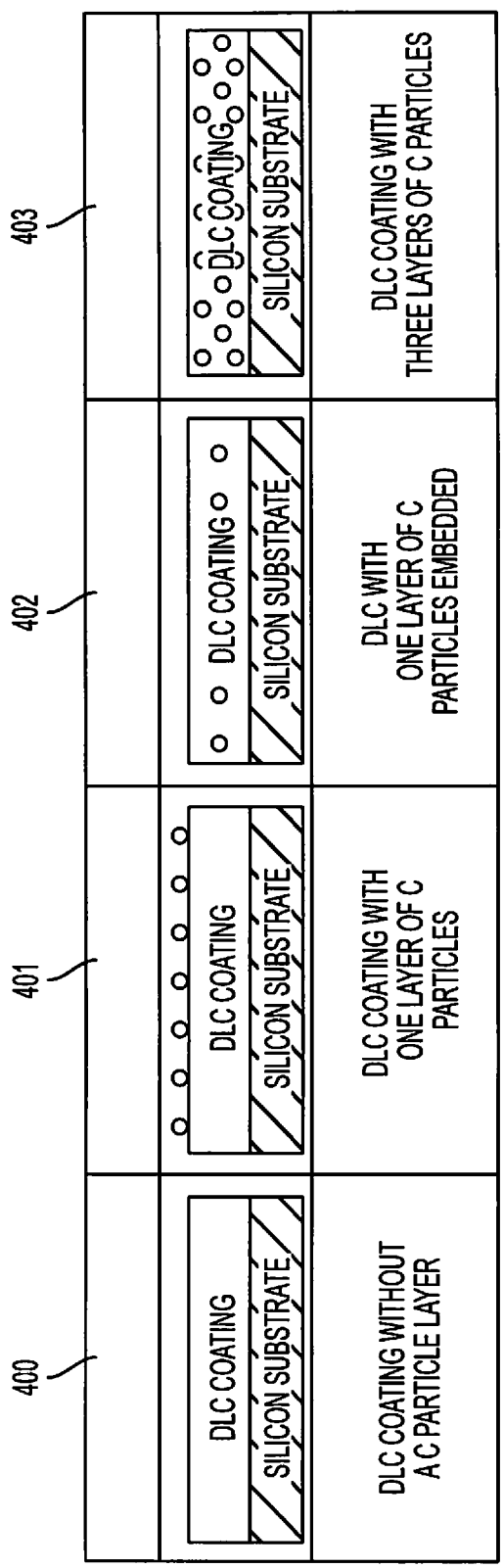
FIG. 4 shows example isolated carbon particle embedded DLC coatings.

For example, the threshold size of carbon particles that yield a simultaneous increased hardness, increased toughness and increased wear resistance may fall in the range of ~50 nm to 100 nm. Regarding the threshold amount of particles, the threshold may be defined in terms of the number of carbon embedded layers included with in the DLC coating. The carbon embedded layers are not layers of pure carbon, but rather layers of the DLC coating within which carbon particles are embedded therein. FIG. 4 shows an example of DLC coatings with a various number of carbon embedded layers. DLC coating 400 comprises no carbon embedded layers. DLC coating 401 comprises one carbon layer on the surface of the DLC coating. DLC coating 402 comprises one carbon layer embedded within the DLC coating. DLC coating 403 comprises three carbon layers. In example embodiments, the threshold number of layers of carbon particles that yield a simultaneous increased hardness, increased toughness and increased wear resistance may be one layer of carbon particles. As explained above, carbon particle formation, carbon particle size, and carbon particle distribution may be selectably controllable during the deposition process. As such, the hardness value of an isolated carbon particle embedded DLC coating may be selectably controllable by a user.

Toughness: In example embodiments, the embedded carbon particles help to stop crack propagation. Specifically, cracks dissipate fracture energy across graphitic particles (e.g., the embedded carbon particles). Depending on the amount of stress concentration on the crack tip and fracture energy, the embedded carbon particles stop an increased number of cracks as compared to conventional DLC coatings. In instances of increased stress concentration, the crack may bifurcate, further propagate through grain boundaries, or split-up a large embedded carbon particle. That being said, the toughness of the isolated carbon particle embedded DLC coating may be increased in embodiments at least because the crack arrest phenomenon is improved by the embedding of carbon particles according to systems and methods herein.

Wear: Conventional wear resistance and friction reduction strategies for conventional DLC coating involve surface modifications, such as, hybrid tribofilm, nanoparticle suspended lubricants, nanostructured surface, and the like. These surface modifications merely focused on the surface of the conventional DLC coating. Conventional surface modifications created a problem because as the surface layer of the conventional DLC coating naturally eroded, the surface modifications, which controlled wear resistance and friction, eroded as well. Once the surface layer of the conventional DLC coating wore away, the conventional DLC coating's wear resistance and friction reduction drastically diminished. In short, when the surface layer eroded, the conventional DLC coating lost its function. As such, a conventional DLC coating's life span is limited to the life span of its surface layer. Isolated carbon particle embedded DLC coating solves this problem. In example isolated carbon particle embedded DLC coatings, the embedded carbon particles provide the lubrication that controls wear resistance and friction reduction. As explained above, carbon particle distribution is selectably controllable during the deposition process. As such, embedded carbon particles may be distributed throughout a plurality of layers of the isolated carbon particle embedded DLC coating, as is desired by the user. With carbon particles embedded in layers below the surface layer, example isolated carbon particle embedded DLC coatings continue to provide wear resistance and friction reduction after the original surface layer has naturally eroded. As such, the life span of example isolated carbon particle embedded DLC coatings are comparatively longer than the life span of conventional DLC coatings. Further, graphitic carbon particles are softer than a conventional hard DLC coating matrix, and during sliding, graphitic carbon particles exhibit larger plastic deformation as compared to a conventional hard DLC coating. Hence, the wear resistance of example isolated carbon particle embedded DLC coatings are significantly increased by the embedding of carbon particles.

In general, the wear rate of embodiments of isolated carbon particle embedded DLC coatings reduce in relation to an increase of carbon particle density. However, when a threshold amount of carbon particles is reached, the carbon particles may begin reducing the isolated carbon particle embedded DLC coating's hardness. As explained above, carbon particle formation, carbon particle size, and carbon particle distribution may be selectably controllable during the deposition process. As such, the hardness value, toughness value, and wear rate of an isolated carbon particle embedded DLC coating may be selectably controllable by a user.

Example systems and methods herein provide an in-situ synthesis of isolated carbon particles simultaneous with DLC coating deposition through unbalanced magnetron sputtering. Embodiments herein allow a user to control the various characteristics and/or parameters based on application dependency (e.g., based on the purpose, function, use of the device being coated by the isolated carbon particle embedded DLC coating). For example, the selected characteristics and/or parameters of an isolated carbon particle embedded DLC coating deposited on a drill bit may be different from the selected characteristics and/or parameters of an isolated carbon particle embedded DLC coating deposited on a plasmonic sensor. Examples of controlled sizes of isolated carbon particles are in the range of 100±20 nm, 250 nm to 350 nm, and ~700 nm. Meanwhile, the isolation distance can be controlled as well and example distances include: less than 1 μm, less than 5 μm, in between 5 μm to 10 μm, and more than 20 μm. Embodiments also involve the formation of ~2 μm random shape agglomerations having an isolation distance of more than 20 μm and made of less than ~100 nm carbon particles. Further, embodiments include systems and methods to controllably form a 150±50 nm sized granular DLC.

In an example, isolated carbon particles are embedded in DLC coatings at a controlled depth. In this example, the isolated carbon particle embedded DLC coating presented ~34% increase in hardness and 21% increase in toughness individually at various particle densities per unit volume. In another example, the isolated carbon particle embedded DLC coating presented a 21% increase in hardness and 9% increase in toughness. As can be seen, example isolated carbon particle embedded DLC coatings may exhibit a simultaneous increase in hardness and toughness.

Control of the isolated carbon particle embedded DLC coating's characteristics may be realized by adjusting the He injection pulse and/or pulses. For example, a 0.5 minute injection duration of He may increase the isolated carbon particle embedded DLC coating's brittle failure; a 3 minute injection duration of He may reduce the isolated carbon particle embedded DLC coating's hardness; however, a moderate injection duration (e.g., 1 minute), was found to avoid the increase brittle failure and hardness reduction. In another example, adjusting the target to substrate distance was found to control the carbon particle density within the isolated carbon particle embedded DLC coating. For instance, increasing the target to substrate distance from 75 mm to 150 mm reduces the carbon particle density received at the substrate. Further, He injections with a higher flow rate produces more carbon particles than an He injection of a lower flow rate (e.g., 100 sccm as compared to 50 sccm). It was further found that when the He injection was set to the high flow rate of 100 sccm for a 3 minute duration, particle agglomeration occurred when the target to substrate distance was 150 mm. However, if the target to substrate distance is reduced to 75 mm for the same injection duration of 3 minutes, there were little to no particles synthesized; instead, it produced granular DLC structure with 90±10 nm grain size. Moreover, carbon particle size may be controlled as desired to be at least the following: (a) ~110±20 nm, (b) ~250 nm-350 nm, (c) ~700 nm, (d) agglomeration of 2 μm composed of ~100 nm particles, and (e) 150±50 nm sized granular DLC. Isolation distance in between carbon particles is also controllable; for example, the isolation distance may be manipulated to be less than 1 μm, less than 5 μm, in between 5 μm and 10 μm, more than 20 μm, and/or 20 μm to 50 μm. Isolated carbon particles may also be embedded at controlled depths to develop multiple isolated carbon particle embedded DLC coating layers.

Due to an increased hardness, increased toughness, and enhanced wear resistance, example isolated carbon particle embedded DLC coatings present an effective alternative to conventional DLC coating, and can be used in place of conventional DLC coatings in any industry (e.g., automotive and machine tool industries). Besides mechanical applications, the disclosed systems and methods may be used to construct low-cost plasmonic sensors, zero-dimensional sensors, and medically embedded particles having medicinal coatings (e.g., anti-bacterial). Further, isolated carbon particle embedded DLC coatings are an ideal replacement for conventional DLC coatings used in microelectromechanical (MEMS) devices. Conventional DLC coatings are traditionally surface modified with wet lubricated and dry/self-lubricant coatings. Conventional dry/self-lubricated coatings have a shorter life as compared to isolated carbon particle embedded DLC coatings. Further, wet lubricants pose interference risks (e.g., leakage, viscosity, boiling/freezing temperature, insulation, heat conduction, and the like) on device performance. Example isolated carbon particle embedded DLC coatings reduce these risks. In MEMS devices, isolated carbon particle embedded DLC coatings provide a reliable and long-lasting, wear resistance solution, wherein depth controlled embedded carbon particles have continued interaction with the counter material during device operation.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
depositing a hydrogen-free diamond-like carbon (DLC) coating on a substrate; and
simultaneously synthesizing isolated carbon particles with the depositing the hydrogen-free DLC coating producing the DLC coating having isolated carbon particles embedded within the hydrogen-free DLC coating, wherein the synthesizing isolated carbon particles comprises injecting a helium pulse.

2. The method of claim 1 wherein the method is provided via unbalanced magnetron sputtering of a pure graphite target.

3. The method of claim 1 wherein the synthesizing isolated carbon particles controls a carbon particle formation based on at least one of:
a helium pulse position as compared to a plasma plume;
a helium pulse orientation as compared to the plasma plume;
a helium pulse injection duration;
a helium flow rate; and
a distance between a target and the substrate.

4. The method of claim 1 wherein the synthesizing isolated carbon particles controls a carbon particle size based on at least one of:
a helium pulse position as compared to a plasma plume;
a helium pulse orientation as compared to the plasma plume;
a helium pulse injection duration;
a helium flow rate; and
a distance between a target and the substrate.

5. The method of claim 1 wherein the synthesizing isolated carbon particles controls a carbon particle distribution based on at least one of:
   a helium pulse position as compared to a plasma plume;
   a helium pulse orientation as compared to the plasma plume;
   a helium pulse injection duration;
   a helium flow rate; and
   a distance between a target and the substrate.

6. The method of claim 1 wherein the hydrogen-free DLC coating comprises a plurality of layers, and wherein the isolated carbon particles are embedded within at least two of the plurality of layers.

7. The method of claim 1 wherein the simultaneously synthesizing isolated carbon particles with the depositing the hydrogen-free DLC coating comprises:
   controlling an amount of the isolated carbon particles embedded within the hydrogen-free DLC coating by manipulating the helium pulse.

8. The method of claim 1 wherein the simultaneously synthesizing isolated carbon particles with the depositing the hydrogen-free DLC coating comprises:
   controlling a size of the isolated carbon particles embedded within the hydrogen-free DLC coating by manipulating the helium pulse.

9. The method of claim 1, wherein a size of the isolated carbon particles embedded within the hydrogen-free DLC coating is at least one of:
   $110 \pm 20$ nm;
   250 nm $-350$ nm;
   700 nm; and
   agglomeration of 2 μm composed of 100 nm particles.

10. The method of claim 1 wherein the simultaneously synthesizing isolated carbon particles with the depositing the hydrogen-free DLC coating comprises:
    controlling an isolation distance between the isolated carbon particles by manipulating the helium pulse.

11. The method of claim 10 wherein the isolation distance is less than 5 μm.

12. The method of claim 10 wherein the isolation distance is between 5 μm and 10 μm.

13. The method of claim 10 wherein the isolation distance is between carbon particles embedded within a same layer.

14. The method of claim 10 wherein the isolation distance is between carbon particles embedded within different layers.

15. The method of claim 1 wherein the isolated carbon particles are embedded within a single layer of the hydrogen-free DLC coating.

16. The method of claim 1 wherein the carbon particles are nano-particles.

* * * * *